(12) United States Patent
Pothier et al.

(10) Patent No.: US 11,692,608 B2
(45) Date of Patent: Jul. 4, 2023

(54) LOCKING ISOLATOR AND METHOD OF ISOLATING A SYSTEM

(71) Applicant: The Boeing Company, Chicago, IL (US)

(72) Inventors: Jared R. Pothier, Maple Valley, WA (US); Nicholas Samuel Lee Smith, Kent, WA (US); Cary D. Munger, Woodinville, WA (US)

(73) Assignee: The Boeing Company, Arlington, VA (US)

( * ) Notice: Subject to any disclaimer, the term of this patent is extended or adjusted under 35 U.S.C. 154(b) by 520 days.

(21) Appl. No.: 16/737,153

(22) Filed: Jan. 8, 2020

(65) Prior Publication Data

US 2021/0207681 A1 Jul. 8, 2021

(51) Int. Cl.

| F16F 15/00 | (2006.01) |
|---|---|
| F16F 15/02 | (2006.01) |
| H02N 2/00 | (2006.01) |
| H02N 2/18 | (2006.01) |
| F16F 9/05 | (2006.01) |
| H10N 30/20 | (2023.01) |

(52) U.S. Cl.
CPC ............ F16F 15/005 (2013.01); F16F 9/052 (2013.01); F16F 15/021 (2013.01); H02N 2/009 (2013.01); H02N 2/186 (2013.01); H10N 30/2042 (2023.02)

(58) Field of Classification Search
CPC ......... F16F 9/052; F16F 15/021; H02N 2/009
See application file for complete search history.

(56) References Cited

U.S. PATENT DOCUMENTS

| 4,162,090 A * | 7/1979 | Schwartz | B60G 11/113 267/52 |
|---|---|---|---|
| 4,288,064 A * | 9/1981 | Austen | H01H 7/00 267/159 |
| 6,126,371 A * | 10/2000 | McCloskey | F16B 1/0014 411/909 |
| 2003/0053912 A1 | 3/2003 | Jacot | |

FOREIGN PATENT DOCUMENTS

| EP | 0112072 A2 * | 11/1983 | |
|---|---|---|---|
| EP | 2 634 095 | 9/2013 | |
| KR | 2012 0134552 | 12/2012 | |
| WO | WO 2004/108532 | 12/2004 | |
| WO | WO-2018099676 A1 * | 6/2018 | F16C 3/04 |

OTHER PUBLICATIONS

European Patent Office, Extended European Search Report, App. No. 20216098.2 (dated Jun. 8, 2021).

* cited by examiner

*Primary Examiner* — Melanie Torres Williams
(74) *Attorney, Agent, or Firm* — Walters & Wasylyna LLC

(57) ABSTRACT

A locking isolator includes one or more joints. The one or more joints are configured to transition between a clearance fit state and an interference fit state in response to a change in temperature. The locking isolator includes a dampener. The dampener is configured to attenuate transmission of vibration through the one or more joints when the one or more joints are in the clearance fit state.

20 Claims, 12 Drawing Sheets

LOCKING ISOLATOR AND METHOD OF ISOLATING A SYSTEM

FIELD

The present disclosure relates generally to the use of isolators in connecting one structure to another structure and, more particularly, to a locking isolator and a method of selectively attenuating vibration using a locking isolator.

BACKGROUND

Certain equipment is sensitive to shock and vibration. The function of such equipment can be disrupted by relatively high shock and vibration forces. In a high energy environment, it may be desirable to isolate such equipment from a supporting structure. However, in a low energy environment, it may be desirable to rigidly fix such equipment to the supporting structure. Conventional shock and vibration absorbers can only attenuate forces between the supporting structure and the equipment and are not capable of fixing the equipment relative to the supporting structure. Separate locking devices can be used to selectively fix the equipment relative to the supporting structure. However, these locking devices are cumbersome and may be prone to failure. Accordingly, those skilled in the art continue with research and development efforts in the field of shock and vibration attenuation and, as such, apparatuses and methods intended to address the above-identified concerns would find utility.

SUMMARY

The following is a non-exhaustive list of examples, which may or may not be claimed, of the subject matter according to the present disclosure.

In an example, a disclosed locking isolator includes one or more joints. The one or more joints are configured to transition between a clearance fit state and an interference fit state in response to a change in temperature. The locking isolator includes a dampener. The dampener is configured to attenuate transmission of vibration through the one or more joints when the one or more joints are in the clearance fit state.

In another example, the disclosed locking isolator includes a base, a linkage coupled to the base, a cap coupled to the linkage, opposite the base. The locking isolator includes a dampener coupled to the base and to the cap. The linkage is configured to transition between an unlocked state, in which the cap is movable relative to the base, and a locked state, in which the cap is fixed relative to the base, in response to a change in temperature. The dampener is configured to attenuate transmission of vibration between the base and the cap when the linkage is in the unlocked state.

In an example, a disclosed method of isolating a first structure from a second structure includes steps of: (1) coupling the first structure and the second structure together using a locking isolator; (2) in response to a change in temperature, transitioning one or more joints of the locking isolator between a clearance fit state, in which the first structure and the second structure are movable relative to each other, and an interference fit state, in which the first structure and the second structure are fixed relative to each other; and (3) attenuating transmission of vibration between the first structure and the second structure using a dampener of the locking isolator with the one or more joints in the clearance fit state.

Other examples of the disclosed system, apparatus, and method will become apparent from the following detailed description, the accompanying drawings, and the appended claims.

DETAILED DESCRIPTION

Figure 1:
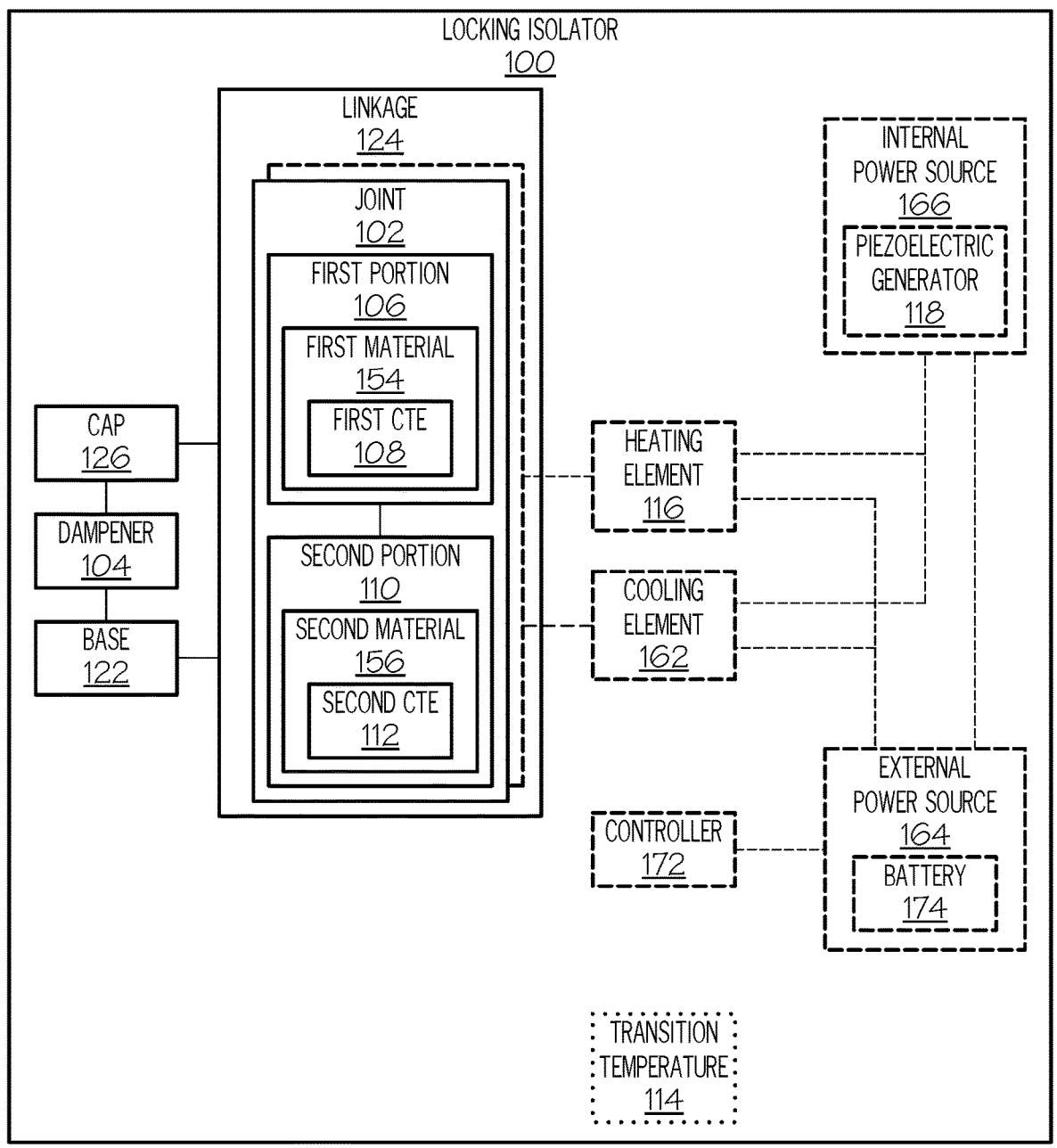
FIG. 1 is a schematic block diagram of an example of a locking isolator.

The following detailed description refers to the accompanying drawings, which illustrate specific examples described by the present disclosure. Other examples having different structures and operations do not depart from the scope of the present disclosure. Like reference numerals may refer to the same feature, element, or component in the different drawings.

Illustrative, non-exhaustive examples, which may be, but are not necessarily, claimed, of the subject matter according the present disclosure are provided below. Reference herein to "example" means that one or more feature, structure, element, component, characteristic, and/or operational step described in connection with the example is included in at least one aspect, embodiment, and/or implementation of the subject matter according to the present disclosure. Thus, the phrases "an example," "another example," "one or more examples," and similar language throughout the present disclosure may, but do not necessarily, refer to the same example. Further, the subject matter characterizing any one example may, but does not necessarily, include the subject matter characterizing any other example. Moreover, the subject matter characterizing any one example may be, but is not necessarily, combined with the subject matter characterizing any other example.

The present disclosure recognizes that certain structural systems include functional equipment that is sensitive to shock and vibration but that also needs to be rigidly fixed during operation. For example, many aerospace vehicles include shock and vibration sensitive equipment, such as communication arrays, guidance systems, vision systems, star trackers, and the like. During periods of relatively high shock and vibration forces, such as during launch of a spacecraft or takeoff/landing of an aircraft, it is beneficial for the system to provide flexibility between a supporting structure and the equipment as well as to absorb transmission of shock and vibration from the supporting structure to the equipment. During periods of relatively low shock and vibration forces, such as during operation of the equipment, it is beneficial for the equipment to be rigidly fixed to the supporting structure.

The present disclosure also recognizes that conventional solutions for isolating structures of a structural system include simple isolation devices that absorb or attenuate shock and vibration between the structures. However, these simple isolation devices are not capable of providing rigidity between the structures in circumstances where rigidity is needed or desired. In such circumstances, a clamp or similar locking device may be used to provide the desired rigidity. However, these locking devices are typically complex and heavy, are controlled by a computer, and require external power for operation. For these reasons, conventional isolation and locking devices may be disadvantageous for various situations in the aerospace industry.

Referring generally to FIGS. 1-11, by way of examples, the present disclosure is directed to a locking isolator 100. Implementations of the locking isolator 100 selectively isolate vibration between structures in certain environments while locking the structures together in other environments without requiring a combination of the conventional independent vibration isolator and locking device described above.

Referring to FIG. 1, in one or more examples, the locking isolator 100 includes one or more joints 102 configured to transition between a clearance fit state and an interference fit state in response to a change in temperature.

As used herein, the term "clearance fit," in reference to the one or more joints 102, refers to a condition in which an airspace or clearance exists between interfacing or mating portions of a joint. A clearance fit has a positive allowance and provides a loose joint in which mating portions of the joint are movable relative to each other. In other words, when in the clearance fit state, a joint enables relative movement between mating portions of the joint.

As used herein, the term "interference fit," in reference to the one or more joints 102, refers to a condition in which an interference exists between interfacing or mating portions of a joint. An interference fit has a negative allowance and provides a tight joint in which mating portions of the joint are immovable relative to each other. In other words, when in the interference fit state, a joint constrains or restricts movement between mating portions of the joint.

For the purpose of the present disclosure, the phrase "change in temperature" can refer to a change in the ambient temperature surrounding the one or more joints 102, a change in temperature of the one or more joints 102 itself, a change in temperature of one or both of the mating portions of the one or more joints 102, or a combination thereof, whichever the case may be.

In one or more examples, the one or more joints 102 of the locking isolator 100 include a plurality of joints 102. The plurality of joints 102 is coupled together. Each one of the plurality of joints 102 is configured to transition between the clearance fit state and the interference fit state in response to the change in temperature. In an example, the one or more joints 102 includes two joints 102. In another example, the one or more joints 102 include three joints 102. In other examples, the locking isolator 100 includes any number of (e.g., four or more) joints 102.

In one or more examples, the locking isolator 100 includes a linkage 124. In one or more examples, the linkage 124 includes the one or more joints 102. In one or more examples, the one or more joints 102 of linkage 124 includes a plurality of joints 102. Each of the one or more joints 102, such as each one of the plurality of joints 102, forms a point at which articulating links of the linkage 124 are joined. In one or more examples, the linkage 124 is configured to transition between an unlocked state, in which the articulating links of the linkage 124 are movable relative to each other, and a locked state, in which articulating links of the linkage 124 are fixed relative to each other, in response to the change in temperature.

For the purpose of the present disclosure, the term "unlocked state," in reference to the linkage 124, refers to a condition in which the one or more joints 102, such as at least one of the plurality of joints 102, is in the clearance fit state. In other words, in the unlocked state, the linkage 124 is flexible.

For the purpose of the present disclosure, the term "locked state," in reference to the linkage 124, refers to a condition in which the one or more joints 102, such as each one of the plurality of joints 102, is in the interference fit state. In other words, in the locked state, the linkage 124 is rigid.

In one or more examples, the locking isolator 100 includes a dampener 104. The dampener 104 is configured to attenuate transmission of shock and vibration through the one or more joints 102, such as the plurality of joints 102, when the one or more joints 102, such as at least one of the plurality of joints 102, is in the clearance fit state. In one or more examples, the dampener 104 is coupled to the one or more joints 102, such as to the plurality of joints 102.

In one or examples, the dampener 104 is configured to attenuate transmission of shock and vibration through the linkage 124 when the linkage 124 is in the unlocked state. In one or more examples, the dampener 104 is coupled to the linkage 124.

Figure 2:
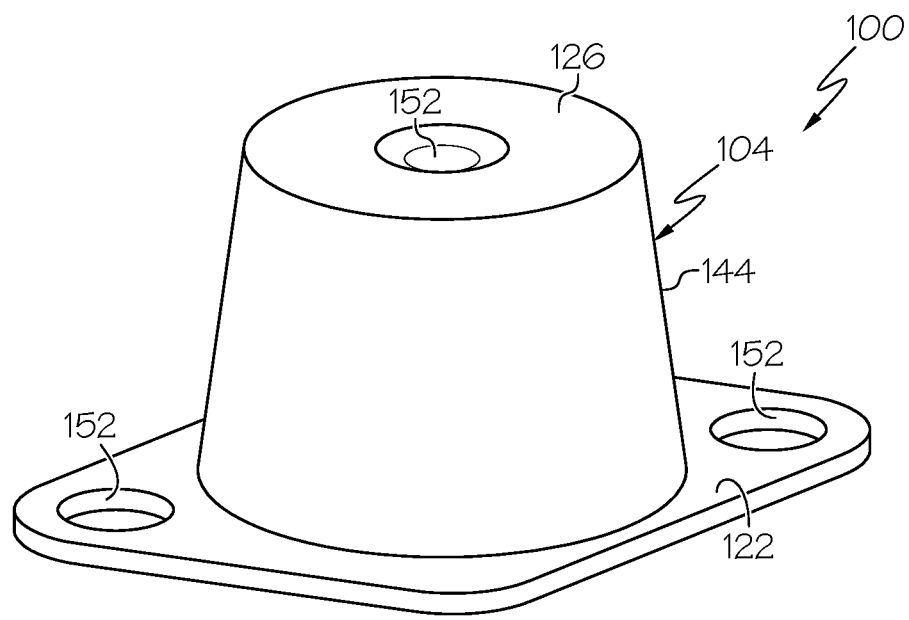
FIG. 2 is a schematic, perspective view of an example of the locking isolator.

FIG. 2 schematically illustrates a practical implementation of the locking isolator 100. In one or more examples, the locking isolator 100 includes a base 122 and a cap 126. The linkage 124 (FIG. 1) is coupled to the base 122. The cap 126 is coupled to the linkage 124, opposite the base 122. The dampener 104 is coupled to the base 122 and to the cap 126. The dampener 104 is configured to attenuate transmission of vibration between the base 122 and the cap 126 when the linkage 124 is in the unlocked state.

In one or more examples, the linkage 124 (FIG. 1) is configured to transition between the unlocked state, in which the cap 126 is movable relative to the base 122, and the locked state, in which the cap 126 is fixed relative to the base 122, in response to the change in temperature. In high energy environments in which shock and vibration forces applied to the structural system 150 are relatively high (e.g., have large magnitudes), the locking isolator 100 enables movement of the cap 126 relative to the base 122 using the linkage 124 in the unlocked state (e.g., with the one or more joints 102 (FIG. 1) in the clearance fit state) and attenuates shock and vibrations transmitted from the base 122 to the cap 126 using the dampener 104. In low energy environments in which shock and vibration forces applied to the structural system 150 are relatively low (e.g., have small magnitudes), the locking isolator 100 rigidly locks the base 122 and the cap 126 together using the linkage 124 in the locked state (e.g., the one or more joints 102 in the interference fit state).

In one or more examples, the base 122 is configured to be coupled to a first structure 146 (FIG. 3) of a structural system 150 (FIG. 3) and the cap 126 is configured to be coupled to a second structure 148 (FIG. 3) of the structural system 150. In one or more examples, the locking isolator 100 includes at least one connecting feature 152. The connecting feature 152 is configured to enable the locking isolator 100 to be connected to the structures of the structural system 150. In an example, the base 122 includes at least one connecting feature 152 and is couplable to the first structure 146 using the at least one connecting feature 152. The cap 126 includes at least one connecting feature 152 and is couplable to the second structure 148 using the at least one connecting feature 152.

In various examples, the connecting feature 152 includes, or takes the form of, any suitable structure that enables two members to be joined. As examples, the connecting feature 152 may include a smooth bored aperture for insertion of a mechanical fastener, a threaded aperture for connection of a threaded fastener, a bonding surface, a weldable surface, and the like. The connecting feature 152 associated with the base 122 and the connection feature 152 associated with the cap 126 may be same or different.

Figure 3:
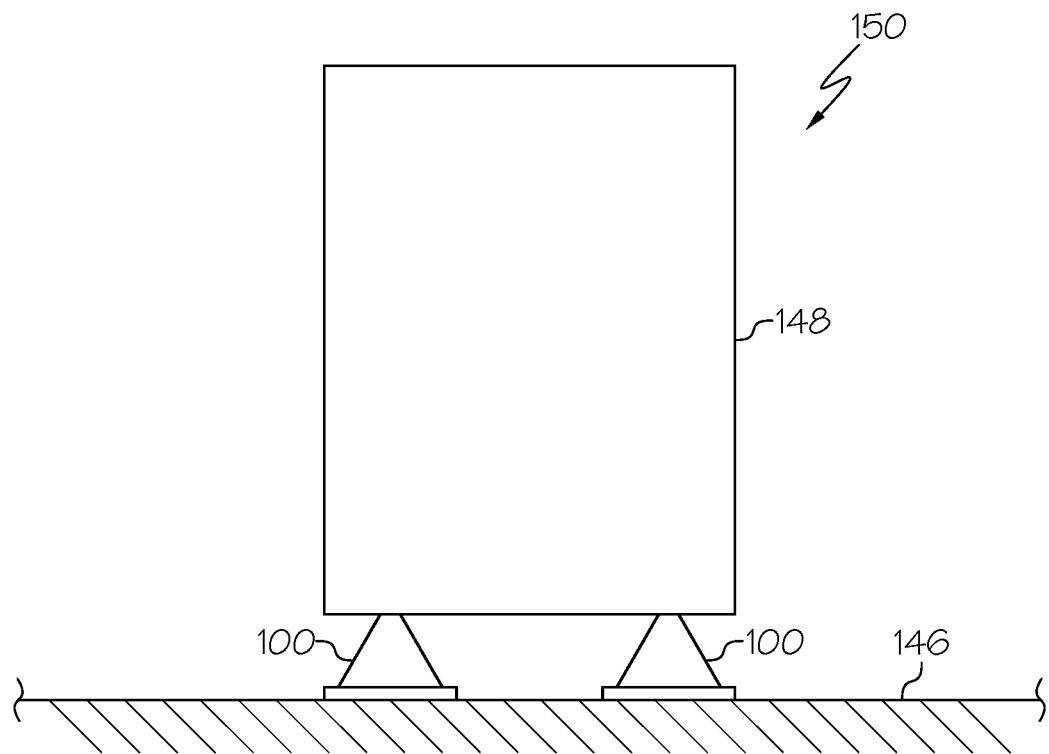
FIG. 3 is a schematic, elevation view of an example of a system using the locking isolator.

FIG. 3 schematically illustrates a practical implementation of the locking isolator 100 used to couple structures of the structural system 150 together. In one or more examples, the structural system 150 includes the first structure 146 and the second structure 148. While two locking isolators 100 are illustrated by example in FIG. 3, in other examples, any number of the locking isolators 100 may be used to couple the first structure 146 and the second structure 148 together. In other examples, the structural system 150 may include any number of other structures, whether not the other structures are coupled together using the locking isolator 100.

The second structure 148 is coupled to the first structure 146 using the locking isolator 100. In the illustrated example, the first structure 146 supports the second structure 148. For example, the first structure 146 is a supporting structure and the second structure 148 is a piece of equipment or a component that is sensitive to shock and vibration. In an example, the structural system 150 forms a part of an aerospace vehicle, such as a spacecraft or an aircraft. The first structure 146 is a component of a frame of the aerospace vehicle and the second structure 148 is a piece of equipment or a component of a system of the aerospace vehicle.

The dampener 104 is configured to attenuate vibration through the structural system 150, such as between the first structure 146 and the second structure 148. In one or more examples, the dampener 104 is configured to attenuate high frequency vibration in a range or spectrum of vibrational frequencies.

Accordingly, in high energy environments in which shock and vibration forces applied to the structural system 150 are relatively high (e.g., have large magnitudes), the locking isolator 100 enables movement of the second structure 148 relative to the first structure 146 using the linkage 124 in the unlocked state (e.g., with the one or more joints 102 in the clearance fit state) and attenuates shock and vibrations transmitted from the first structure 146 to the second structure 148 using the dampener 104. In low energy environments in which shock and vibration forces applied to the structural system 150 are relatively low (e.g., have small magnitudes), the locking isolator 100 rigidly locks the first structure 146 and the second structure 148 together using the linkage 124 in the locked state (e.g., the one or more joints 102 in the interference fit state).

Referring again to FIG. 1, in one or more examples, each of the one or more joints 102, such as each one of the plurality of joints 102, includes a first portion 106 and a second portion 110. The first portion 106 has a first coefficient of thermal expansion ("CTE") 108. The second portion 110 has a second coefficient of thermal expansion 112. The first coefficient of thermal expansion 108 and the second coefficient of thermal expansion 112 are different.

In one or more examples, the coefficient of thermal expansion, in reference to the first portion 106 and the second portion 110 of the one or more joints 102, refers to the linear coefficient of thermal expansion.

In one or more examples, the difference between the first coefficient of thermal expansion 108 and the second coefficient of thermal expansion 112 is at least approximately 5 ($10^{-6}$ m/(m K)). In one or more examples, the difference between the first coefficient of thermal expansion 108 and the second coefficient of thermal expansion 112 is at least approximately 8 ($10^{-6}$ m/(m K)). In one or more examples, the difference between the first coefficient of thermal expansion 108 and the second coefficient of thermal expansion 112 is at least approximately 14 ($10^{-6}$ m/(m K)).

Is can be appreciated that greater differences in the coefficient of thermal expansion between the first portion 106 and the second portion 110 may enable transition between the clearance fit state and the interference fit state of the one or more joints 102 (e.g., transition between the unlocked state and the locked state of the linkage 124) in response to a lesser change in temperature (e.g., smaller ΔT) or at a lower transition temperature. Similarly, lesser differences in the coefficient of thermal expansion between the first portion 106 and the second portion 110 may enable transition between the clearance fit state and the interference fit state of the one or more joints 102 (e.g., transition between the unlocked state and the locked state of the linkage 124) in response to a greater change in temperature (e.g., larger ΔT) or at a higher transition temperature.

In one or more examples, the first portion 106 of the one or more joints 102 is formed of a first material 154 having the first coefficient of thermal expansion 108 and the second portion 110 of the one or more joints 102 is formed of a second material 156 having the second coefficient of thermal expansion 112.

In or more examples, at least one of the first portion 106 and the second portion 110 of the one or more joints 102 is formed of a metallic material. As examples, at least one of the first material 154 and the second material 156 is selected from brass (having a CTE of approximately 19 ($10^{-6}$ m/(m K)), carbon steel (having a CTE of approximately 11 ($10^{-6}$ m/(m K)), and tungsten (having a CTE of approximately 4.5 ($10^{-6}$ m/(m K)). Other metals are also contemplated for the first portion 106 and the second portion 110 of the one or more joints 102.

In one or more examples, at least one of the first portion 106 and the second portion 110 of the one or more joints 102 is formed of a metallic alloy. As examples, at least one of the first material 154 and the second material 156 is selected from an nickel-iron alloy, such as Invar, (having a CTE of approximately 1.2 ($10^{-6}$ m/(m K)) and a nickel-chromium alloy, such as Inconel, (having a CTE of approximately 11 ($10^{-6}$ m/(m K)), and nickel-copper alloy, such as Monel, (having a CTE of approximately 13.5 ($10^{-6}$ m/(m K)). Other metallic alloys are also contemplated for the first portion 106 and the second portion 110 of the one or more joints 102.

Arrangement of the first portion 106 and the second portion 110 of the one or more joints 102 depend, for example, on whether the one or more joints 102 are configured to be in the clearance fit state at lower temperatures and in the interference fit state at higher temperatures or whether the one or more joints 102 are configured to be in the clearance fit state at higher temperatures and in the interference fit state at lower temperatures. Selection of the materials of the first portion 106 and the second portion 110 of the one or more joints 102 depend, for example, on the temperature needed to transition the one or more joints 102 between the clearance fit state and the interference fit state (referred to herein as transition temperature ("TT") 114) and the amount of thermal expansion or thermal contraction achievable at the transition temperature 114.

In one or more examples, the one or more joints 102 are configured to be in the interference fit state below the transition temperature 114 and in the clearance fit state above the transition temperature 114. For example, the first portion 106 and the second portion 110 are fixed relative to each other below the transition temperature 114 and are movable relative to each other above the transition temperature 114. Therefore, in these examples, the linkage 124 is configured to be in the unlocked state below the transition temperature 114 and in the locked state above the transition temperature 114.

In one or more examples, the one or more joints 102 are configured to be in the clearance fit state below the transition temperature 114 and in the interference fit state above the transition temperature 114. For example, the first portion 106 and the second portion 110 are movable relative to each other below the transition temperature 114 and fixed relative to each other above the transition temperature 114. Therefore, in these examples, the linkage 124 is configured to be in the locked state below the transition temperature 114 and in the unlocked state above the transition temperature 114.

Figure 4:
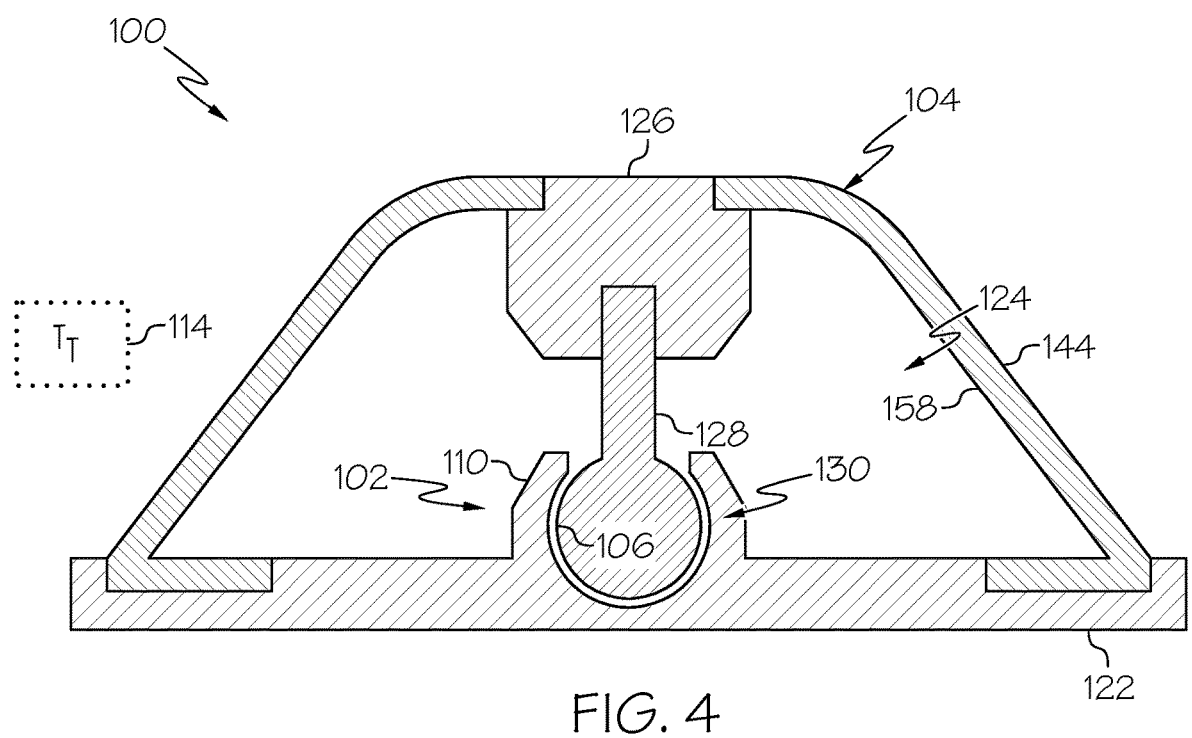
FIG. 4 is a schematic, elevation, sectional view of an example of the locking isolator.

Referring to FIG. 4, in one or more examples, the linkage 124 includes a first link 128. A first end of the first link 128 is coupled to the base 122 by a first joint 130. A second end of the first link 128, opposite the first end, is coupled (e.g., fixed) to the cap 126. The first joint 130 is an example of the one or more joints 102 (FIG. 1).

In these examples, the first portion 106 of the first joint 130 is formed by the first end of the first link 128 and the second portion 110 of the first joint 130 is formed by the base 122. In these examples, the first joint 130 enables movement of the first link 128 relative to the base 122 and, thus, the cap 126 relative to the base 122 when the first joint 130 is in the clearance fit state and restricts movement of the first link 128 relative to the base 122 and, thus, the cap 126 relative to the base 122 when the first joint 130 is in the interference fit state.

Figure 5:
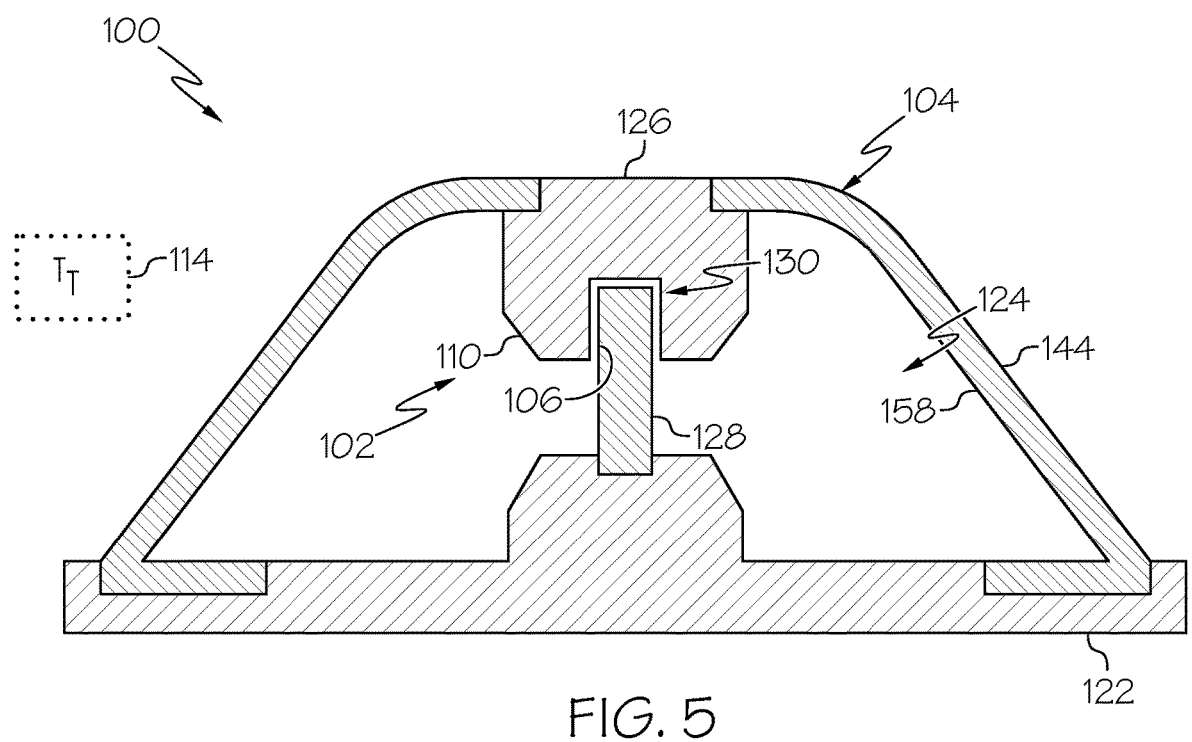
FIG. 5 is a schematic, elevation, sectional view of an example of the locking isolator.

Referring to FIG. 5, in one or more examples, the linkage 124 includes the first link 128. The first end of the first link 128 is coupled (e.g., fixed) to the base 122. The second end of the first link 128 is coupled to the cap 126 by the first joint 130. The first joint 130 is an example of the one or more joints 102.

In these examples, the first portion 106 of the first joint 130 is formed by the second end of the first link 128 and the second portion 110 of the first joint 130 is formed by the base 122. In these examples, the first joint 130 enables movement of the cap 126 relative to the first link 128 and, thus, the cap 126 relative to the base 122 when the first joint 130 is in the clearance fit state and restricts movement of the cap 126 relative to the first link 128 and, thus, the cap 126 relative to the base 122 when the first joint 130 is in the interference fit state.

Figure 6:
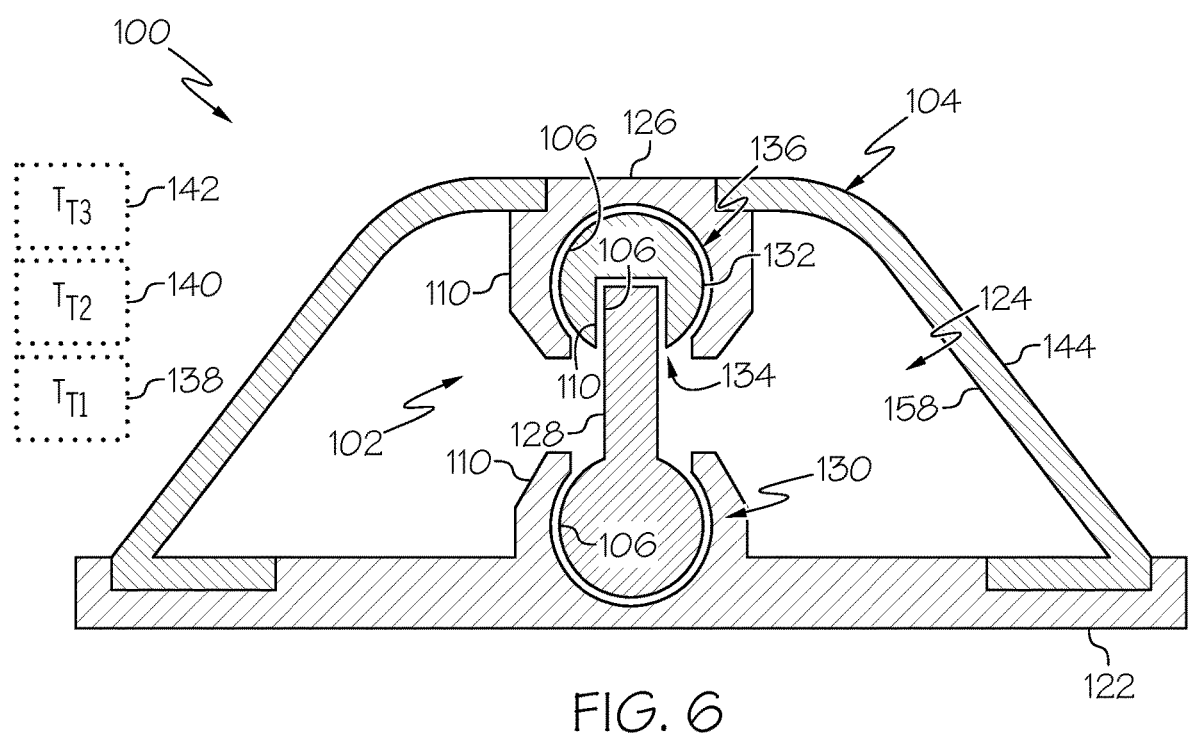
FIG. 6 is a schematic, elevation, sectional view of an example of the locking isolator.

Referring to FIG. 6, in one or more examples, the linkage 124 includes a first link 128 and a second link 132. The first end of the first link 128 is coupled to the base 122 by a first joint 130 of the one or more joints 102. A first end of the second link 132 is coupled to the second end of the first link 128 by a second joint 134 of the one or more joints 102, opposite the base 122. A second end of the second link 132 is coupled to the cap 126 by a third joint 136 of the one or more joints 102, opposite the first link 128. The second joint 134 is an example of one of the one or more joints 102 (FIG. 1). The third joint 136 is an example of one of the one or more joints 102.

In these examples, the first portion 106 of the first joint 130 is formed by the first end of the first link 128 and the second portion 110 of the first joint 130 is formed by the base 122. The first portion 106 of the second joint 134 is formed by the second end of the first link 128 and the second portion 110 of the second joint 134 is formed by the first end of the second link 132. The first portion 106 of the third joint 136 is formed by the second end of the second link 132 and the second portion 110 of the third joint 136 is formed by the cap 126.

In these examples, the first joint 130 enables movement of the first link 128 relative to the base 122 and, thus, the cap 126 relative to the base 122 when the first joint 130 is in the clearance fit state and restricts movement of the first link 128 relative to the base 122 and, thus, the cap 126 relative to the base 122 when the first joint 130 is in the interference fit state. The second joint 134 enables movement of the second link 132 relative to the first link 128 and, thus, the cap 126 relative to the base 122 when the second joint 134 is in the clearance fit state and restricts movement of the second link 132 relative to the first link 128 and, thus, the cap 126 relative to the base 122 when the second joint 134 is in the interference fit state. The third joint 136 enables movement of the cap 126 relative to the second link 132 and, thus, the cap 126 relative to the base 122 when the third joint 136 is in the clearance fit state and restricts movement of the cap 126 relative to the second link 132 and, thus, the cap 126 relative to the base 122 when the third joint 136 is in the interference fit state.

While FIG. 6 illustrates an example of the locking isolator 100 in which the linkage 124 has two links (e.g., the first link 128 and the second link 132) and having three joints 102 (e.g., the first joint 130, the second joint 134, and the third joint 136) connecting the linkage 124, the base 122, and the cap 126 together, in other examples, the locking isolator 100 includes other configurations of the linkage 124, any number of links, and any number of joints 102.

In the various examples, each joint 102 of the one or more joints 102, such as the first joint 130, the second joint 134, and the third joint 136, are configured to transition between the clearance fit state and the interference fit state at the transition temperature 114 (FIG. 1). In one or more examples, the transition temperature 114 for each joint 102 of the one or more joints 102, such as each one of the plurality of joints 102, is the same. In one or more other examples, the transition temperature 114 for at least one of the plurality of joints 102 is different than the transition temperature 114 for at least another one of the plurality of joints 102. In one or more other examples, the transition temperature 114 for each joint 102 of the one or more joints 102, such as each one of the plurality of joints 102, is different. Accordingly, depending on the number of joints 102, the type of joints 102, and the configuration and arrangement of the joints 102, the locking isolator 100 is capable of controlling the amount of movement and/or the type of movement through the linkage 124 at one or more different transition temperatures 114.

Referring still to FIG. 6, in one or more examples, above a first transition temperature ("$T_{T1}$") 138, the first joint 130 has a clearance fit, in which the first link 128 is movable relative to the base 122. In one or more examples, above the first transition temperature ("$T_{T1}$") 138, the first joint 130 has an interference fit, in which the first link 128 is fixed relative to the base 122.

In one or more examples, above a second transition temperature ("$T_{T2}$") 140, the second joint 134 has the clearance fit, in which the second link 132 is movable relative to the first link 128. In one or more examples, above the second transition temperature ("$T_{T2}$") 140, the second joint 134 has the interference fit, in which the second link 132 is fixed relative to the first link 128.

In one or more examples, above a third transition temperature ($T_{T3}$") 142, the third joint 136 has the clearance fit, in which the cap 126 is movable relative to the second link 132. In one or more examples, above a third transition temperature ($T_{T3}$") 142, the third joint 136 has the interference fit, in which the cap 126 is fixed relative to the second link 132.

In one or more examples, the first transition temperature 138, the second transition temperature 140, and the third transition temperature 142 are the same. In one or more examples, at least one of the first transition temperature 138, the second transition temperature 140, and the third transition temperature 142 is different than at least another one of the first transition temperature 138, the second transition temperature 140, and the third transition temperature 142. In one or more examples, each one of the first transition temperature 138, the second transition temperature 140, and the third transition temperature 142 is different.

Referring to FIGS. 5 and 6, in one or more examples, at least one of the one or more joints 102, such as at least one of the plurality of joints 102, is configured for linear movement when in the clearance fit state. In one or more examples, at least one of the one or more joints 102, such as the first joint 130 in FIG. 5 or the second joint 134 in FIG. 6, includes, or takes the form of a slide bearing, a plain bearing, a linear sliding joint, a prismatic joint, and the like.

Referring to FIGS. 4 and 6, in one or more examples, at least one of the one or more joints 102, such as at least one of the plurality of joints 102, is configured for pivotal or rotational movement when in the clearance fit state. In one or more examples, at least one of the one or more joints 102, such as the first joint 130 in FIGS. 4 and 6 or the third joint 136 in FIG. 6, includes, or takes the form of, a spherical bearing, a rotary joint, a ball joint, and the like.

In one or more examples, the locking isolator 100 is configured to enable linear movement between the cap 126 and the base 122 and, thus, linear movement between the second structure 148 and the first structure 146 (FIG. 3). In these examples, such as illustrated in FIG. 5, the one or more joints 102 (e.g., the first joint 130) includes the slide bearing.

In one or more examples, the locking isolator 100 is configured to enable pivotal or rotational movement between the cap 126 and the base 122 and, thus, pivotal or rotational movement between the second structure 148 and the first structure 146 (FIG. 3). In these examples, such as illustrated in FIG. 4, the one or more joints 102 (e.g., the first joint 130) includes the spherical bearing.

In one or more examples, the locking isolator 100 is configured to enable both linear movement and pivotal or rotational movement between the cap 126 and the base 122 and, thus, linear movement and pivotal or rotational movement between the second structure 148 and the first structure 146 (FIG. 3). In these examples, such as illustrated in FIG. 6, at least one of the one or more joints 102 (e.g., the first joint 130 and the third joint 136) includes the spherical bearing and at least one of the one or more joints 102 (e.g., the second joint 134) includes the slide bearing.

Referring to FIGS. 4-6, in one or more examples, the dampener 104 includes, or takes the form of, an elastomer member 158 (e.g., is formed of an elastomeric material). In one or more examples, the dampener 104, such as the elastomer member 158, forms a housing 144 (e.g., an exterior housing of the locking isolator 100) the is disposed around (e.g., surrounds) the linkage 124 and extends between the base 122 and the cap 126.

In one or more examples, the elastomer member 158 is formed from natural rubber. In one or more examples, the elastomer member 158 is formed from synthetic rubber. In one or more examples, the elastomer member 158 is formed from isoprene. In one or more examples, the elastomer member 158 is formed from silicon. In one or more examples, the elastomer member 158 is formed from at least one of natural rubber, synthetic rubber, isoprene, silicon, polyisoprene, butadiene-styrene (e.g., styrene-butadiene rubber (SBR)), polychloroprene (e.g., pc-rubber), ethylene propylene diene monomer (EPDM) rubber, polyacrylic, and polyurethane.

Figure 7:
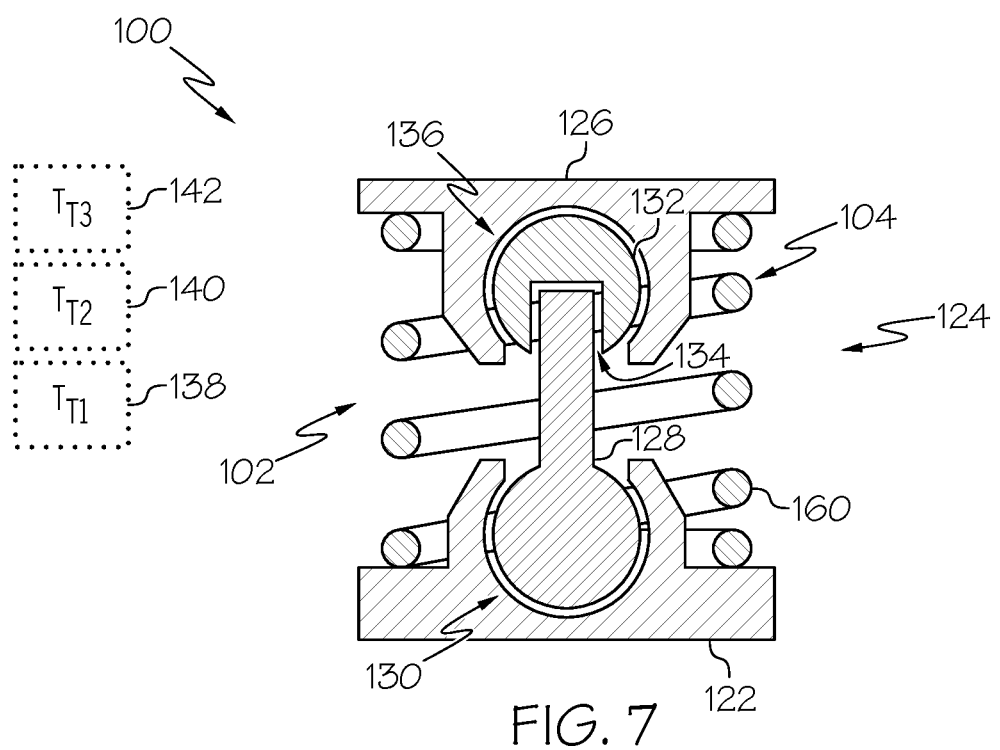
FIG. 7 is a schematic, elevation, sectional view of an example of the locking isolator.

Referring to FIG. 7, in one or more examples, the dampener 104 includes, or takes the form of, a spring 160. In one or more examples, the dampener 104, such as the spring 160, is a coil spring disposed around the linkage 124 and extending between the base 122 and the cap 126. In certain applications, such as in the aerospace industry, use of the spring 160 as the dampener 104 over the elastomer member 158 may be beneficial because the spring 160 is less susceptible to outgassing.

In other examples, other types of shock and vibration absorbing members and/or materials are used as the dampener 104. As an example, the dampener 104 may include at least one shock and vibration absorbing member connected to and extending between the base 122 and the cap 126 without forming an exterior housing of the locking isolator 100. In such examples, the shock and vibration absorbing member is expandable, compressible, and flexible.

Figure 8:
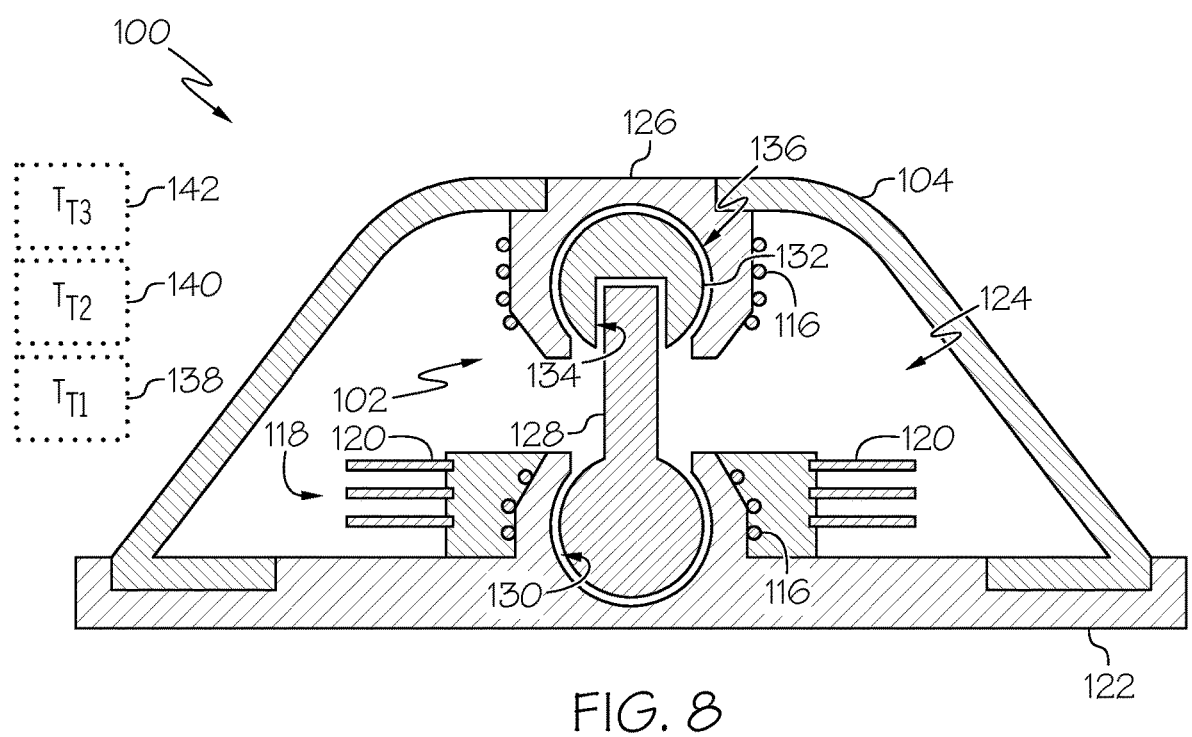
FIG. 8 is a schematic, elevation, sectional view of an example of the locking isolator.

Referring to FIG. 8, in one or more examples, the locking isolator 100 includes a heating element 116. The heating element 116 is configured to cause the change in temperature. For example, the heating element 116 is configured to increase the temperature of at least one of the one or more joints 102, such as at least one of the plurality of joints 102, past the transition temperature 114 (FIG. 1) of the one or more joints 102 to transition the one or more joints 102 between the clearance fit state and the interference fit state.

In one or more examples, the heating element 116 is in thermal communication with the linkage 124. In one or more examples, the heating element 116 is in thermal communication with the one or more joints 102, such as at least one of or each one of the plurality of joints 102. In these examples, a single heating element 116 is used to heat the one or more joints 102, such as each one of the plurality of joints 102, such as the first joint 130, the second joint 134, and the third joint 136 illustrated in FIG. 8.

In one or more examples, the locking isolator 100 includes a plurality of heating elements 116. In these examples, each one of the plurality of heating elements 116 is configured to heat a corresponding joint 102 of the one or more joints 102, such as a corresponding one of the plurality of joints 102. For example, an independent heating element 116 is used to heat each joint 102 of the one or more joints 102, such as each one of the plurality of joints 102, such as the first joint 130, the second joint 134, and the third joint 136 illustrated in FIG. 8.

In one or more examples, as illustrated in FIG. 8, a first one or the plurality of heating elements 116 is configured to heat the first joint 130 above the first transition temperature 138 to transition the first joint 130 from the clearance fit state to the interference fit state or to transition the first joint 130 from the interference fit state to the clearance fit state. A second one or the plurality of heating elements 116 is configured to heat the second joint 134 above the second transition temperature 140 to transition the first joint 130 from the clearance fit state to the interference fit state or to transition the first joint 130 from the interference fit state to the clearance fit state. A third one or the plurality of heating elements 116 is configured to heat the third joint 136 above the third transition temperature 142 to transition the third joint 136 from the clearance fit state to the interference fit state or to transition the third joint 136 from the interference fit state to the clearance fit state.

In one or more examples, the heating element 116 includes, or takes the form of, at least one coil heater, such as a high resistance heating element. In one or more examples, the heating element 116 (e.g., the coil heater) is coupled to (e.g., is wrapped around) least a portion of at least one of the linkage 124, the one or more joints 102, the base 122 and/or the cap 126. In one or more examples, the heating element 116 includes a nichrome heating element that is insulated by a silicone or ceramic insulating layer.

In one or more examples, the heating element 116 includes, or takes the form of, a thermoelectric heater. In other examples, various other suitable types of heaters or heating devices are contemplated for use as the heating element 116.

Figure 9:
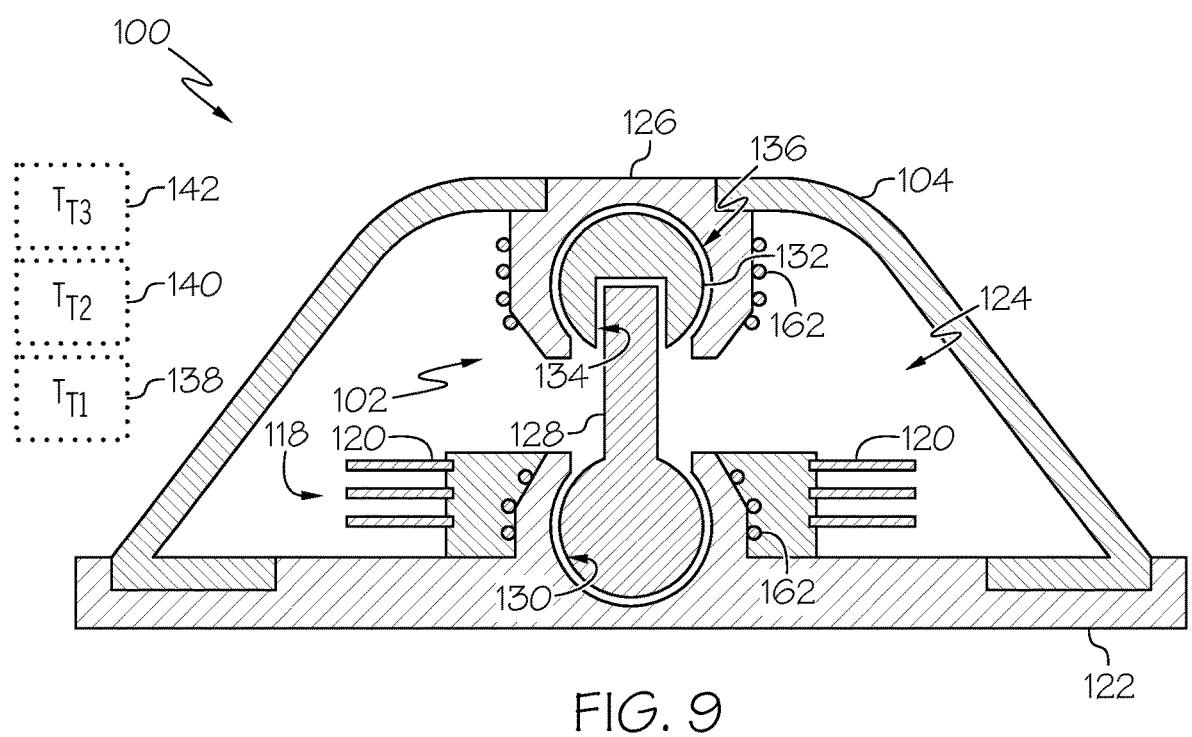
FIG. 9 is a schematic, elevation, sectional view of an example of the locking isolator.

Referring to FIG. 9, in one or more examples, the locking isolator 100 includes a cooling element 162. The cooling element 162 is configured to cause the change in temperature. For example, the cooling element 162 is configured to reduce the temperature of at least one of the one or more joints 102, such as at least one of the plurality of joints 102, below the transition temperature 114 (FIG. 1) of the one or more joints 102 to transition the one or more joints 102 between the clearance fit state and the interference fit state.

In one or more examples, the cooling element 162 is in thermal communication with the linkage 124. In one or more examples, the cooling element 162 is in thermal communication with the one or more joints 102, such as at least one of or each one of the plurality of joints 102. In these examples, a single cooling element 162 is used to remove heat from (e.g., cool) each joint 102 of the one or more joints 102, such as each one of the plurality of joints 102, such as the first joint 130, the second joint 134, and the third joint 136 illustrated in FIG. 8.

In one or more examples, the locking isolator 100 includes a plurality of cooling elements 162. In these examples, each one of the plurality of cooling elements 162 is configured to remove heat from (e.g., cool) a corresponding joint 102 of the one or more joints 102, such as a corresponding one of the plurality of joints 102. For example, an independent cooling element 162 is used to remove heat from each joint 102 of the one or more joints 102, such as each one of the plurality of joints 102, such as the first joint 130, the second joint 134, and the third joint 136 illustrated in FIG. 9.

In one or more examples, as illustrated in FIG. 9, a first one or the plurality of cooling elements 162 is configured to cool the first joint 130 below the first transition temperature 138 to transition the first joint 130 from the clearance fit state to the interference fit state or to transition the first joint 130 from the interference fit state to the clearance fit state. A second one or the plurality of cooling elements 162 is configured to cool the second joint 134 below the second transition temperature 140 to transition the first joint 130 from the clearance fit state to the interference fit state or to transition the first joint 130 from the interference fit state to the clearance fit state. A third one or the plurality of cooling elements 162 is configured to cool the third joint 136 below the third transition temperature 142 to transition the third joint 136 from the clearance fit state to the interference fit state or to transition the third joint 136 from the interference fit state to the clearance fit state.

In one or more examples, the cooling element 162 includes, or takes the form of, at least one thermoelectric element, such as a peltier element. In one or more examples, the cooling element 162 also includes a thermal sink (e.g., a radiation plate, a finned heat sink, and the like).

In one or more examples, the locking isolator 100 includes a combination of at least one heating element 116 (FIG. 8) and at least one cooling element 162. In these examples, the heating element 116 is configured to heat at least one of the one or more joints 102, such as at least one of the plurality of joints 102, above the transition temperature 114 (FIG. 1) and the cooling element 162 is configured to cool at least one of the one or more joints 102, such as at least one of the plurality of joints 102, below the transition temperature 114.

Referring to FIG. 1, in one or more examples, the heating element 116 and/or the cooling element 162 is powered by an external power source 164. In one or more examples, the external power source 164 is a source of electrical power provided by the structural system 150 (e.g., the aerospace vehicle) or any other suitable external source. In one or more examples, the external power source 164 is a battery 174 or other electrical power storage cell.

In one or more examples, the heating element 116 and/or the cooling element 162 is powered by an internal power source 166. For example, the internal power source 166 forms a part of the locking isolator 100. In one or more examples, the internal power source 166 includes a suitable power generator that is configured to generate electrical power in response to vibration (e.g., converts vibration forces into electrical energy).

Referring to FIGS. 8 and 9, in one or more examples, the locking isolator 100 includes a piezoelectric generator 118. The piezoelectric generator 118 is an example of the internal power source 166 (FIG. 1). The piezoelectric generator 118 is configured to generate electric power in response to mechanical strain.

As illustrated in FIG. 8, in one or more examples, the piezoelectric generator 118 is in electrical communication with the heating element 116. The electric power energizes the heating element 116. As illustrated in FIG. 9, in one or more examples, the piezoelectric generator 118 is in electrical communication with the cooling element 162. The electric power energizes the cooling element 162.

In one or more examples, the piezoelectric generator 118 is in electrical communication with the plurality of heating elements 116. The electric power energizes each one of the plurality of heating elements 116. In one or more examples, the piezoelectric generator 118 is in electrical communication with the plurality of cooling elements 162. The electric power energizes each one of the plurality of cooling elements 162.

Figure 10:
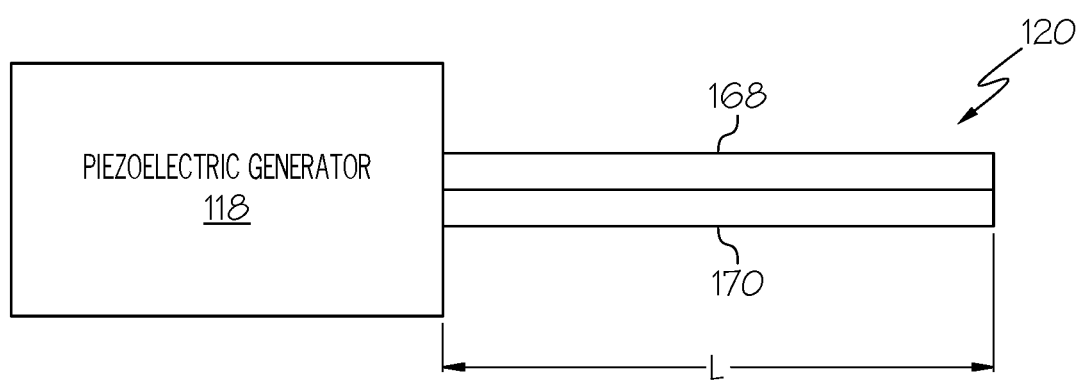
FIG. 10 is a schematic illustration of an example of a piezoelectric generator of the locking isolator.

Referring to FIGS. 8-10, in one or more examples, the piezoelectric generator 118 includes a piezoelectric cantilever 120. In one or more examples, the piezoelectric generator 118 includes a plurality of piezoelectric cantilevers 120 (FIGS. 8 and 9). The piezoelectric cantilever 120, such as each one of the plurality of piezoelectric cantilevers 120, is configured to deflect in response to the vibration.

As illustrated in FIG. 10, in one or more examples, the piezoelectric cantilever 120, such as each one of the plurality of piezoelectric cantilevers 120 (FIGS. 8 and 9), has a length L. In one or more examples, the length L is selected to resonate at an approximate frequency of vibration or at a range of approximate frequencies of vibration. For example, the length L can be increased or decreased to tune (e.g., modify or selectively adjust) the piezoelectric cantilever 120 to a selected or desired resonant frequency or range of resonant frequencies.

In an example, the length L is selected to resonate between approximately 40 Hz and approximately 5,000 Hz. In another example, the length L is selected to resonate between approximately 60 Hz and approximately 1,200 Hz. In yet another example, the length L is selected to resonate between approximately 100 Hz and approximately 300 Hz.

In one or more examples, the piezoelectric cantilever 120 includes at least one piezoelectric element 168, such as a strip of a piezoelectric material. In one or more examples, the piezoelectric cantilever 120 includes at least one support element 170, such as a strip of support material. In these examples, the at least one piezoelectric element 168 is coupled to and is supported by the at least one support element 170. In one or more examples, the piezoelectric cantilever 120 is a laminate structure formed by at least one layer of the piezoelectric element 168 that is coupled to and supported by at least one layer of the support element 170.

In these examples, use of the support element 170 depends, for example, on the magnitude of the shock and vibration forces acting on the piezoelectric cantilever 120 during a high energy event. For example, where the piezoelectric cantilever 120 is intended to be used in very highly energic environments in which the shock and vibration forces are relatively high, the support element 170 is used to provide a backing for the piezoelectric element 168.

In one or more examples, the piezoelectric cantilever 120 is a laminate structure formed by a plurality of layers of the piezoelectric element 168. Additional layers of the piezoelectric element 168 provide additional current in response to the mechanical strain induced in the piezoelectric cantilever 120 in response to deflection of the piezoelectric cantilever 120 due to shock and vibration.

In one example implementation, the support element 170 of the piezoelectric cantilever 120, such as each one of the plurality of piezoelectric cantilevers 120 (FIGS. 8 and 9), is made of aluminum and has a thickness of approximately 0.032 inch (0.81 millimeter). In an example of this implementation, the length L of the piezoelectric cantilever 120, such as the support element 170 of the piezoelectric cantilever 120, is approximately 0.5 inch (12.7 millimeters) and resonates at approximately 4,064 Hz. In another example of this implementation, the length L of the piezoelectric cantilever 120, such as the support element 170 of the piezoelectric cantilever 120, is approximately 1.0 inch (25.4 millimeters) and resonates at approximately 1016 Hz. In another example of this implementation, the length L of the piezoelectric cantilever 120, such as the support element 170 of the piezoelectric cantilever 120, is approximately 2.0 inches (50.8 millimeters) and resonates at approximately 254 Hz. In another example of this implementation, the length L of the piezoelectric cantilever 120, such as the support element 170 of the piezoelectric cantilever 120, is approximately 3.0 inch (76.2 millimeters) and resonates at approximately 113 Hz. In another example of this implementation, the length L of the piezoelectric cantilever 120, such as the support element 170 of the piezoelectric cantilever 120, is approximately 4.0 inch (101.6 millimeters) and resonates at approximately 64 Hz. In yet another example of this implementation, the length L of the piezoelectric cantilever 120, such as the support element 170 of the piezoelectric cantilever 120, is approximately 5.0 inch (127 millimeters) and resonates at approximately 41 Hz.

In one or more examples, the piezoelectric cantilever 120, such as the support element 170 of the piezoelectric cantilever 120, has any one of various thicknesses. For example, the thickness of the piezoelectric cantilever 120, such as the thickness of the support element 170 of the piezoelectric cantilever 120, can be increased or decreased to tune (e.g., modify or selectively adjust) the resonant frequency of the piezoelectric cantilever 120 to a selected or desired length L or to tune the length L of the piezoelectric cantilever 120 to a selected to desired resonant frequency.

In one or more examples, as illustrated in FIG. 10, the support element 170 and the piezoelectric element 168 have the same length (e.g., length L). In one or more other examples, the support element 170 and the piezoelectric element 168 have different lengths. For example, the support element 170 forms the length L of the piezoelectric cantilever 120 and the piezoelectric element 168 is mounted to the support element 170 and has a length that is less than the length of the support element 170.

Figure 11:
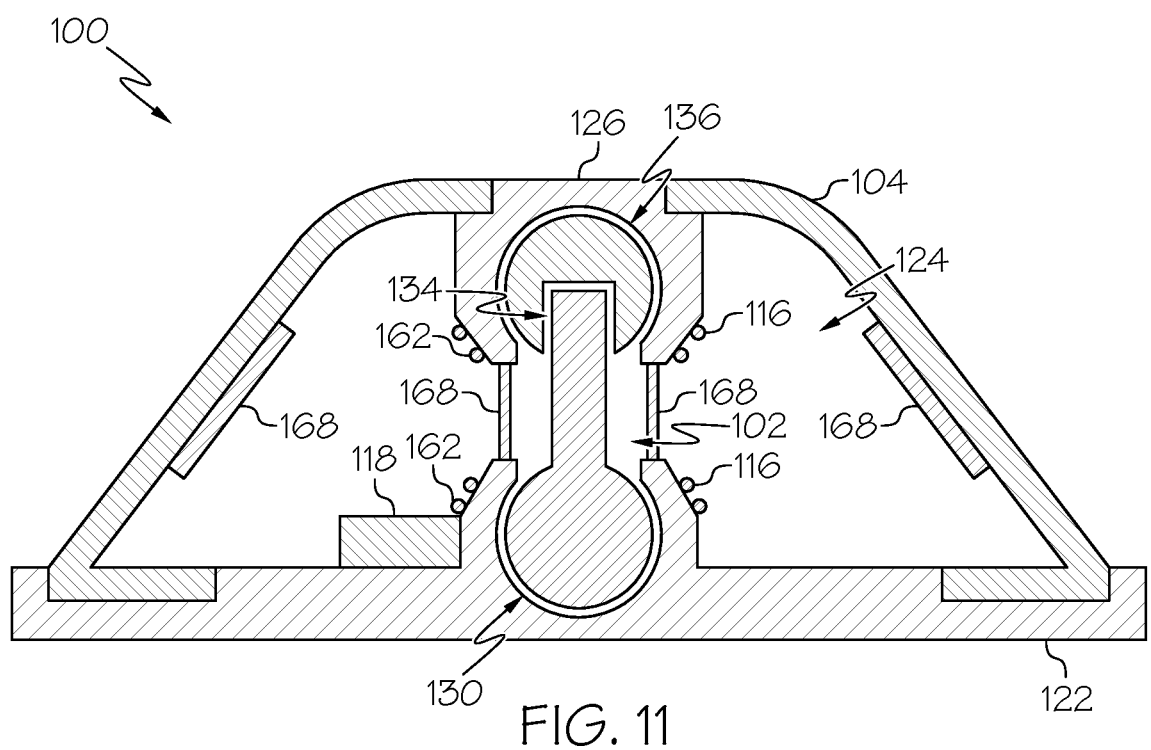
FIG. 11 is a schematic, elevation, sectional view of an example of the locking isolator.

Referring to FIG. 11, in one or more examples, various other configurations of the piezoelectric generator 118 are also contemplated. In one or more examples, at least one piezoelectric element 168 is coupled to the dampener 104. In these examples, deformation of the dampener 104 due to shock and vibration causes mechanical strain to the induced in the piezoelectric element 168 by deforming (e.g., compressing, bending, etc.) the piezoelectric element 168. In one or more examples, at least one piezoelectric element 168 is coupled between the base 122 and the cap 126. In these examples, movement of the cap 126 relative to the base 122 due to shock and vibration causes mechanical strain to the induced in the piezoelectric element 168 by deforming (e.g., compressing, bending, etc.) the piezoelectric element 168. In one or more examples, the piezoelectric generator 118 includes a combination of different configurations of the piezoelectric elements 168, such as in the form of the piezoelectric cantilever 120, as coupled to the dampener 104, and/or as coupled between the base 122 and the cap 126.

Accordingly, in examples of the locking isolator 100 that utilize the internal power source 166, such as the piezoelectric generator 118, electrical power needed to heat and/or cool the one or more joints 102 is provided passively in response to shock and vibration forces acting on the locking isolator 100. Such passive power generation does not rely on computer control or external power, which beneficially reduces the likelihood of failure.

Referring again to FIG. 1, in one or more examples, the internal power source 166, such as the piezoelectric generator 118, is coupled to and is in electrical communication with the external power source 164, such as the battery 174. In these examples, the electrical energy generated by the piezoelectric generator 118 is transmitted to and is stored by the battery 174 for later use, rather than immediately being used to energize the heating element 116 and/or the cooling element 162. In these examples, the electrical energy stored in the battery 174 is selectively provided to the heating element 116 and/or the cooling element 162 by a controller 172, such as at a desired time or for a desired period.

Figure 12:
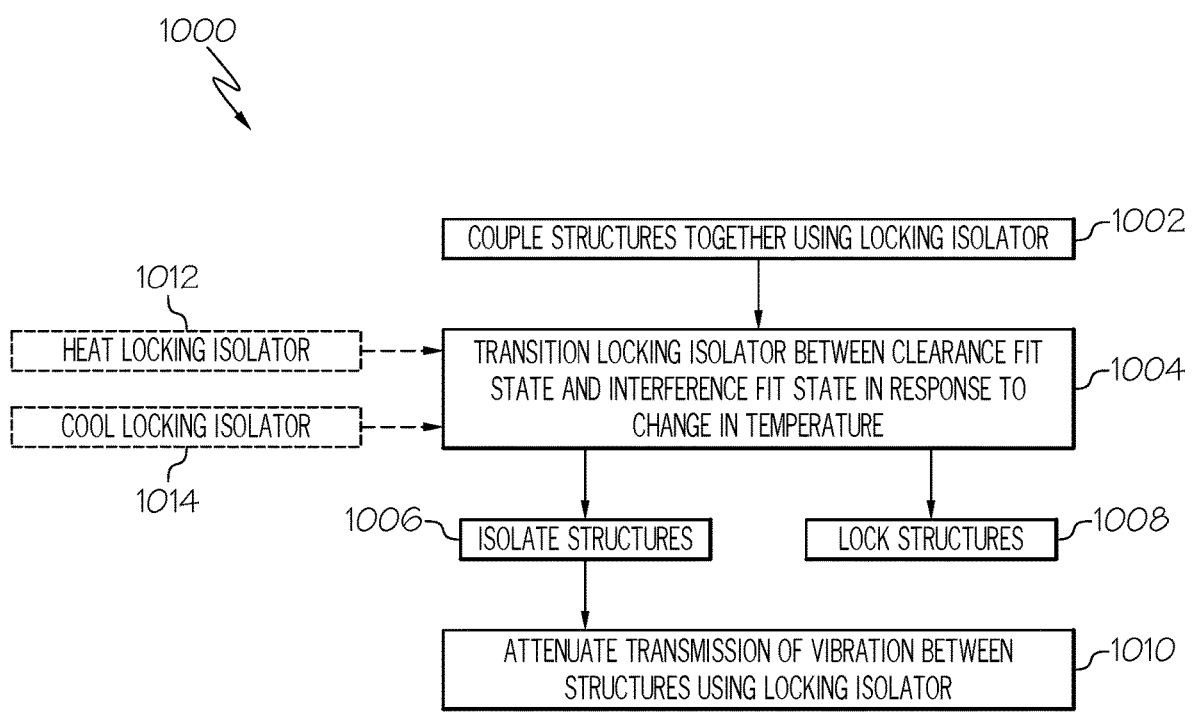
FIG. 12 is a flow diagram of an example of a method of isolating a system.

Referring to FIG. 12, by way of examples, the present disclosure is also directed to a method 1000 of isolating a first structure from a second structure. For example, the method 1000 relates to isolating the first structure 146 of the structural system 150 from the second structure 148 of the structural system 150. Referring generally to FIGS. 1-11, in one or more example, implementation of the method 1000 is performed using the disclosed locking isolator 100.

The method 1000 includes a step of (block 1002) coupling structures together using the locking isolator 100. In one or more examples, the step of (block 1002) coupling structures together includes a step of coupling the first structure 146 of the structural system 150 and the second structure 148 of the structural system 150 together using the locking isolator 100.

In one or more examples, the step of (block 1002) coupling structures together includes a step of coupling the first structure 146 of the structural system 150 and the second structure 148 of the structural system 150 together using a plurality of locking isolators 100.

The method 1000 further includes a step of (block 1004) transitioning the locking isolator 100 between a clearance fit state and an interference fit state in response to a change in temperature.

In one or more examples, the step of (block 1004) transitioning the locking isolator 100 between the clearance fit state and the interference fit state includes a step of, in response to the change in temperature, transitioning the one or more joints 102 of the locking isolator 100 between the clearance fit state, in which the first structure 146 and the second structure 148 are movable relative to each other, and the interference fit state, in which the first structure 146 and the second structure 148 are fixed relative to each other.

In one or more examples, the step of (block 1004) transitioning the locking isolator 100 between the clearance fit state and the interference fit state includes a step of, in response to the change in temperature, transitioning the one or more joints 102, such as the plurality of joints 102, of the locking isolator 100 between the clearance fit state, in which the first structure 146 and the second structure 148 are movable relative to each other, and the interference fit state, in which the first structure 146 and the second structure 148 are fixed relative to each other.

In one or more examples, the step of (block 1004) transitioning the locking isolator 100 between the clearance fit state and the interference fit state includes a step of, in response to the change in temperature, transitioning the linkage 124 the locking isolator 100 between the unlocked state, in which the first structure 146 and the second structure 148 are movable relative to each other, and the locked state, in which the first structure 146 and the second structure 148 are fixed relative to each other.

In one or more examples, the method 1000 includes a step of (block 1006) isolating the structures. In one or more examples, step of (block 1006) isolating the structures includes a step of isolating the second structure 148 from the first structure 146 by enabling the second structure 148 to move relative to the first structure 146 by configuring the one or more joints 102, such as at least one of the plurality of joints 102, in the clearance fit state or configuring the linkage 124 in the unlocked state.

In one or more examples, the method 1000 includes a step of (block 1008) locking the structures. In one or more examples, step of (block 1008) locking the structures includes a step of locking the first structure 146 and the second structure 148 together by configuring the one or more joints 102, such as each one of the plurality of joints 102, in the interference fit state or configuring the linkage 124 in the locked state.

The method 1000 further includes a step of (block 1010), attenuating transmission of vibration between the structures using the locking isolator 100. In one or more examples, the step of (block 1010) attenuating transmission of vibration includes a step of attenuating transmission of vibration between the first structure 146 and the second structure 148 using the dampener 104 of the locking isolator 100 with the one or more joints 102, such as at least one of or each one of the plurality of joints 102, in the clearance fit state.

In one or more examples, the step of (block 1010) attenuating transmission of vibration includes a step of attenuating transmission of vibration between the first structure 146 and the second structure 148 using the dampener 104 of the locking isolator 100 with the linkage 124 in the unlocked state.

In one or more examples, the method 1000 includes a step of (block 1012) heating the locking isolator 100. In these examples, heating the locking isolator 100 results in, or causes, the change in temperature, such as above the transition temperature 114 of the one or more joints 102.

In one or more examples, the step of (block 1012) heating the locking isolator 100 includes a step of moving the structural system 150 from a first ambient temperature to a second ambient temperature, in which the second ambient temperature is greater than the first ambient temperature and is greater than the transition temperature 114.

In one or more examples, the step of (block 1012) heating the locking isolator 100 includes a step of heating the one or more joints 102, such as at least one of the plurality of joints 102, to a temperature that is greater than the transition temperature 114. In one or more examples, the step of (block 1012) heating the locking isolator 100, includes a step of heating the one or more joints 102, such as at least one of the plurality of joints 102, using the heating element 116.

In one or more examples, the method 1000 includes a step of (block 1014) cooling the locking isolator 100. In these examples, cooling the locking isolator 100 results in, or causes, the change in temperature, such as below the transition temperature 114 of the one or more joints 102.

In one or more examples, the step of (block 1014) cooling the locking isolator 100 includes a step of moving the structural system 150 from a first ambient temperature to a second ambient temperature, in which the second ambient temperature is less than the first ambient temperature and is less than the transition temperature 114.

In one or more examples, the step of (block 1014) cooling the locking isolator 100 includes a step of cooling (e.g., removing heat from) the one or more joints 102, such as at least one of the plurality of joints 102, to a temperature that is less than the transition temperature 114. In one or more examples, the step of (block 1014) cooling the locking isolator 100, includes a step of cooling the one or more joints 102, such as at least one of the plurality of joints 102, using the cooling element 162.

In one or more examples, each of the one or more joints 102, such as each one of the plurality of joints 102, includes the first portion 106, having the first coefficient of thermal expansion 108, and the second portion 110, having the second coefficient of thermal expansion 112. The first coefficient of thermal expansion 108 and the second coefficient of thermal expansion 112 are different.

In one or more examples, the step of (block 1012) heating the locking isolator 100 includes a step of heating the one or more joints 102, such as at least one of the plurality of joints 102, above the transition temperature 114 to expand the first portion 106 relative to the second portion 110 or to expand the second portion 110 relative to the first portion 106.

In one or more examples, the step of (block 1014) cooling the locking isolator 100 includes a step of cooling the one or more joints 102, such as at least one of the plurality of joints 102, below the transition temperature 114 to contract the first portion 106 relative to the second portion 110 or to contract the second portion 110 relative to the first portion 106.

In one or more examples, the step of (block 1012) heating the locking isolator 100 includes a step of generating electric power in response to a mechanical strain using the piezoelectric generator 118 and a step of energizing the heating element 116 using the electric power.

In one or more examples, the step of (block 1014) cooling the locking isolator 100 includes a step of generating electric power in response to a mechanical strain using the piezoelectric generator 118 and a step of energizing the cooling element 162 using the electric power.

In one or more examples, the piezoelectric generator 118 includes the piezoelectric cantilever 120, such as the plurality of piezoelectric cantilevers 120. In these examples, the step of generating electric power includes a step of deflecting the piezoelectric cantilever 120, such as at least one of or each one of the plurality of piezoelectric cantilevers 120, in response to the vibration. Deflection of the piezoelectric cantilever 120, such as one or more of the plurality of piezoelectric cantilevers 120, creates the mechanical strain.

In one or more examples, the step of deflecting the piezoelectric cantilever 120, such as one or more of the plurality of piezoelectric cantilevers 120, includes a step of resonating the piezoelectric cantilever 120, such as at least one of or each one of the plurality of piezoelectric cantilevers 120, at a range of frequencies of the vibration.

Accordingly, the disclosed locking isolator 100 and method 1000 provide for selective isolation of vibration between structures in certain environments, such as between a supporting structure and a piece of equipment that is sensitive to shock and vibration in high energy, dynamic environments. The disclosed locking isolator 100 and method 1000 also provide for selective locking between structures in certain other environments, such as between a supporting structure and a piece of equipment in low energy, or substantially static, environments.

The disclosed locking isolator 100 and method 1000 advantageously enables numerous tuning options for thermal activation and deactivation and/or vibrational activation and deactivation. As an example, the locking isolator 100 can be tuned to provide rigidity at lower vibration levels (e.g., lower magnitudes) and flexibility (with shock and vibration absorption) at higher vibration levels (e.g., higher magnitudes). As another example, the locking isolator 100 can be tuned to provide flexibility (with shock and vibration absorption) at lower vibration levels (e.g., lower magnitudes) and rigidity at higher vibration levels (e.g., higher magnitudes). As another example, the locking isolator 100 can be tuned to provide rigidity at lower temperatures and flexibility (with shock and vibration absorption) at higher temperatures. As another example, the locking isolator 100 can be tuned to provide flexibility (with shock and vibration absorption) at lower temperatures and rigidity at higher temperatures.

In some implementations of the disclosed locking isolator 100 and the method 1000, selection between an isolated state and a locked state is performed passively. In other words, in one or more implementations, the disclosed locking isolator 100 and the method 1000 advantageously do not require external power or external controls. For example, selection between the isolated state and the locked state occurs due to a change in environment. As an example, selection between the isolated state and the locked state occurs in response to a change in temperature of the ambient environment, such as when an ambient temperature exceeds a threshold temperature. As another example, selection between the isolated state and the locked state occurs in response to a change in vibration, such as when vibration (e.g., a magnitude of the vibration) exceeds a threshold vibration level (e.g., a threshold magnitude of the vibration). In these examples, vibration magnitudes above a preselected threshold generate sufficient electrical power using the piezoelectric generator 118 to heat or cool the one or more joints 102 using the heating element 116 or the cooling element 162, respectively, to transition between the isolated and locked states.

In other implementations of the disclosed locking isolator 100 and the method 1000, selection between an isolated state and a locked state is performed actively. In these examples, electrical energy is provided by the external power source 164, such as the battery 174 at a predetermined to selected time.

Figure 13:
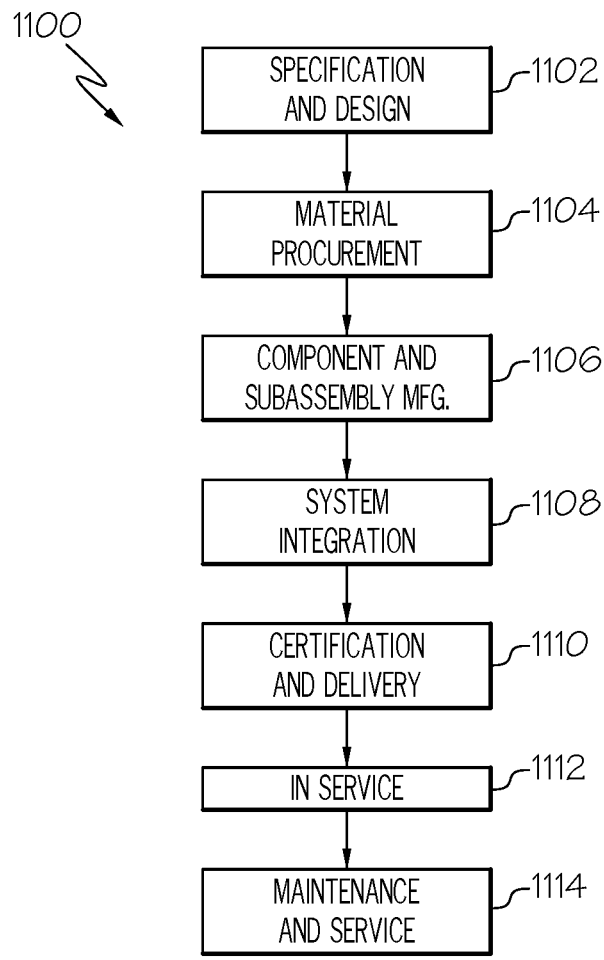
FIG. 13 is a flow diagram of an aircraft manufacturing and service methodology.
Figure 14:
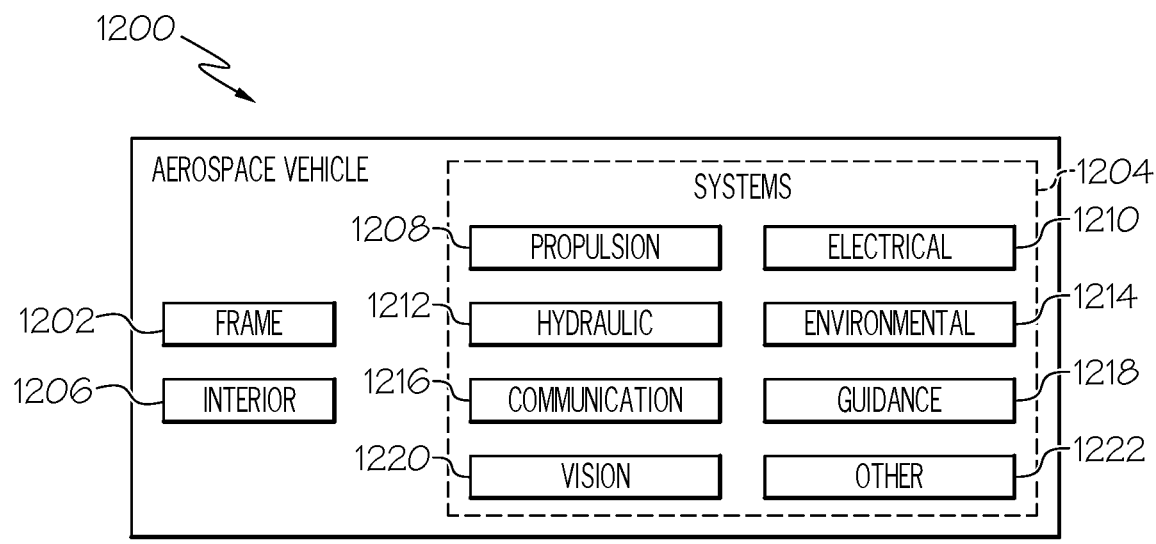
FIG. 14 is a schematic block diagram of an example of an aerospace vehicle.

Referring now to FIGS. 13 and 14, examples of the locking isolator 100 and the method 1000 may be used in the context of an aerospace vehicle manufacturing and service method 1100, as shown in the flow diagram of FIG. 13 and the aerospace vehicle 1200, as schematically illustrated in FIG. 14.

Referring to FIG. 14, the aerospace vehicle 1200 includes any one of various types of vehicles capable of travelling within and outside of the Earth's atmosphere, such as, but not limited to, aircraft, spacecraft, satellites, rockets, and the like. In one or more examples, the aerospace vehicle 1200 includes an underlying frame 1202, an interior 1206, and a plurality of high-level systems 1204. Examples of the high-level systems 1204 include one or more of a propulsion system 1208, an electrical system 1210, a hydraulic system 1212, an environmental system 1214, a communication system 1216, a guidance system 1218, and a vision system 1220. In other examples, the aerospace vehicle 1200 may include any number of other 1222 types of systems.

Examples of the locking isolator 100 and implementations of the method 1000 may be used to connect a piece of equipment or component associated with one of the high-level systems 1204, which is sensitive to shock and vibration forces, to the frame 1202. As such the equipment or component can be rigidly fixed in certain environments and isolated in other environments.

Referring to FIG. 13, during pre-production, the method 1100 includes specification and design of the aerospace vehicle 1200 (block 1102) and material procurement (block 1104). During production of the aerospace vehicle 1200, component and subassembly manufacturing (block 1106) and system integration (block 1108) of the aerospace vehicle 1200 take place. Thereafter, the aerospace vehicle 1200 goes through certification and delivery (block 1110) to be placed in service (block 1112). Routine maintenance and service (block 1114) includes modification, reconfiguration, refurbishment, etc. of one or more systems of the aerospace vehicle 1200.

Each of the processes of the method 1100 illustrated in FIG. 13 may be performed or carried out by a system integrator, a third party, and/or an operator (e.g., a customer). For the purposes of this description, a system integrator may include, without limitation, any number of manufacturers and major-system subcontractors; a third party may include, without limitation, any number of vendors, subcontractors, and suppliers; and an operator may be an airline, leasing company, military entity, service organization, and so on.

Examples of the locking isolator 100 and the method 1000 shown and described herein may be employed during any one or more of the stages of the manufacturing and service method 1100 shown in the flow diagram illustrated by FIG. 13. In an example, implementations of the disclosed locking isolator 100 and method 1000 may form a portion of component and subassembly manufacturing (block 1106) and/or system integration (block 1108). For example, assembly of the aerospace vehicle 1200 and/or installation of various equipment and components thereof using implementations of the disclosed locking isolator 100 and method 1000 may correspond to component and subassembly manufacturing (block 1106) and may be prepared in a manner similar to components or subassemblies prepared while the aerospace vehicle 1200 is in service (block 1112). Also, implementations of the disclosed locking isolator 100 and method 1000 may be utilized during system integration (block 1108) and certification and delivery (block 1110). Similarly, implementations of the disclosed locking isolator 100 and method 1000 may be utilized, for example and without limitation, while the aerospace vehicle 1200 is in service (block 1112) and during maintenance and service (block 1114).

Although an aerospace (e.g., aircraft or spacecraft) example is shown, the examples and principles disclosed herein may be applied to other industries, such as the automotive industry, the construction industry, electronics industry, the wind turbine industry, and other design and manufacturing industries. Accordingly, in addition to aircraft and spacecraft, the examples and principles disclosed herein may apply to shock and vibration isolation systems of other vehicles (e.g., land vehicles, marine vehicles, construction vehicles, etc.), machinery, and stand-alone structures.

As used herein, a system, apparatus, device, structure, article, element, component, or hardware "configured to" perform a specified function is indeed capable of performing the specified function without any alteration, rather than merely having potential to perform the specified function after further modification. In other words, the system, apparatus, device, structure, article, element, component, or hardware "configured to" perform a specified function is specifically selected, created, implemented, utilized, programmed, and/or designed for the purpose of performing the specified function. As used herein, "configured to" denotes existing characteristics of a system, apparatus, structure, article, element, component, or hardware that enable the system, apparatus, structure, article, element, component, or hardware to perform the specified function without further modification. For purposes of this disclosure, a system, apparatus, device, structure, article, element, component, or hardware described as being "configured to" perform a particular function may additionally or alternatively be described as being "adapted to" and/or as being "operative to" perform that function.

Unless otherwise indicated, the terms "first," "second," "third," etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

For the purpose of this disclosure, the terms "coupled," "coupling," and similar terms refer to two or more elements that are joined, linked, fastened, attached, connected, put in communication, or otherwise associated (e.g., mechanically, electrically, fluidly, optically, electromagnetically) with one another. In various examples, the elements may be associated directly or indirectly. As an example, element A may be directly associated with element B. As another example, element A may be indirectly associated with element B, for example, via another element C.

As used herein, the terms "about" and "approximately" refer to or represent a condition that is close to, but not exactly, the stated condition that still performs the desired function or achieves the desired result. As an example, the terms "about" and "approximately" refer to a condition that is within an acceptable predetermined tolerance or accuracy. For example, the terms "about" and "approximately" refer to a condition that is within 10% of the stated condition. However, the terms "about" and "approximately" do not exclude a condition that is exactly the stated condition.

In FIGS. 1 and 14, referred to above, the blocks represent functional elements, features, and/or components related to examples of the subject matter disclosed herein. Lines, if any, connecting the various elements, features, and/or components represent mechanical, electrical, fluid, optical, electromagnetic and other couplings and/or combinations thereof. Elements, features, and/or components, if any, represented with dashed lines, may be selectively provided or indicate alternative examples of the subject matter disclosed herein. Dashed lines, if any, connecting blocks designating the various elements, features, and/or components represent couplings similar in function and purpose to those represented by solid lines; however, couplings represented by dashed lines may either be selectively provided or may relate to alternative examples of the subject matter disclosed herein. Environmental elements, if any, are represented with dotted lines. It will be understood that not all associations among the various disclosed elements, features, and/or components are necessarily represented. Accordingly, couplings other than those depicted in the figures may also exist.

In FIGS. 1-11 and 14, referred to above, virtual (imaginary) elements may also be shown for clarity. Those skilled in the art will appreciate that some of the elements, features, and/or components described and illustrated in FIGS. 1-11 and 14 may be combined in various ways without the need to include other features described and illustrated in FIGS. 1-11 and 14, other drawing figures, and/or the accompanying disclosure, even though such combination or combinations are not explicitly illustrated herein. Similarly, additional features not limited to the examples presented, may be combined with some or all of the features shown and described herein. Unless otherwise explicitly stated, the schematic illustrations of the examples depicted in FIGS. 1-11 and 14, referred to above, are not meant to imply structural limitations with respect to the illustrative example. Rather, although one illustrative structure is indicated, it is to be understood that the structure may be modified when appropriate. Accordingly, modifications, additions and/or omissions may be made to the illustrated structure. Additionally, those skilled in the art will appreciate that not all elements described and illustrated in FIGS. 1-11 and 14, referred to above, need be included in every example and not all elements described herein are necessarily depicted in each illustrative example.

In FIGS. 12 and 13, referred to above, the blocks may represent operations, steps, and/or portions thereof and lines connecting the various blocks do not imply any particular order or dependency of the operations or portions thereof. Blocks represented by dashed lines indicate alternative operations and/or portions thereof. It will be understood that not all dependencies among the various disclosed operations are necessarily represented. FIGS. 12 and 13 and the accompanying disclosure describing the operations of the disclosed methods set forth herein should not be interpreted as necessarily determining a sequence in which the operations are to be performed. Rather, although one illustrative order is indicated, it is to be understood that the sequence of the operations may be modified when appropriate. Accordingly, modifications, additions and/or omissions may be made to the operations illustrated and certain operations may be performed in a different order or simultaneously. Additionally, those skilled in the art will appreciate that not all operations described need be performed.

Further, references throughout the present specification to features, advantages, or similar language used herein do not imply that all of the features and advantages that may be realized with the examples disclosed herein should be, or are in, any single example. Rather, language referring to the features and advantages is understood to mean that a specific feature, advantage, or characteristic described in connection with an example is included in at least one example. Thus, discussion of features, advantages, and similar language used throughout the present disclosure may, but do not necessarily, refer to the same example.

The described features, advantages, and characteristics of one example may be combined in any suitable manner in one or more other examples. One skilled in the relevant art will recognize that the examples described herein may be practiced without one or more of the specific features or advantages of a particular example. In other instances, additional features and advantages may be recognized in certain examples that may not be present in all examples. Furthermore, although various examples of the locking isolator 100 and the method 1000 have been shown and described, modifications may occur to those skilled in the art upon reading the specification. The present application includes such modifications and is limited only by the scope of the claims.

What is claimed is:

1. A locking isolator, comprising:
   one or more joints, configured to transition from a clearance fit state to an interference fit state in response to a first change in temperature and to transition from the interference fit state to the clearance fit state in response to a second change in temperature;
   a dampener, configured to attenuate transmission of vibration through the one or more joints when the one or more joints are in the clearance fit state;
   a heating element, configured to cause at least one of the first change in temperature and the second change in temperature; and
   a piezoelectric cantilever, configured to deflect in response to the vibration and to generate electrical energy to energize the heating element.

2. The locking isolator of claim 1, wherein each joint of the one or more joints comprises:
   a first portion, having a first coefficient of thermal expansion; and
   a second portion, having a second coefficient of thermal expansion that is different than the first coefficient of thermal expansion.

3. The locking isolator of claim 2, wherein:
   the first portion and the second portion are fixed relative to each other below a transition temperature; and
   the first portion and the second portion are movable relative to each other above the transition temperature.

4. The locking isolator of claim 2, wherein:
   the first portion and the second portion are movable relative to each other below a transition temperature; and
   the first portion and the second portion are fixed relative to each other above the transition temperature.

5. The locking isolator of claim 1, wherein the heating element is thermally coupled to the one or more joints and is configured to directly heat the one or more joints.

6. The locking isolator of claim 1, wherein the piezoelectric cantilever has a length that is selected to resonate at a range of frequencies of the vibration.

7. The locking isolator of claim 1, further comprising a piezoelectric element, configured to generate the electric power in response to a mechanical strain,
   wherein the piezoelectric element is coupled to the dampener or at least one of the joints.

8. The locking isolator of claim 1, further comprising a cooling element, configured to cause at least one of the first change in temperature and the second change in temperature,
   wherein the piezoelectric cantilever energizes the cooling element.

9. The locking isolator of claim 1, wherein the piezoelectric cantilever comprises:
   a support element; and
   a piezoelectric element, laminated to the support element.

10. A locking isolator, comprising:
    a base;
    a linkage, coupled to the base;
    a cap, coupled to the linkage, opposite the base;
    a dampener, coupled to the base and to the cap;
    a heating element, configured to heat the linkage; and
    a piezoelectric cantilever, configured to deflect in response to vibration and to generate electric power to energize the heating element,
    wherein:
    the linkage is configured to transition from an unlocked state, in which the cap is movable relative to the base, to a locked state, in which the cap is fixed relative to the base, in response to a first change in temperature and to transition from the locked state to the unlocked state in response to a second change in temperature; and
    the dampener is configured to attenuate transmission of the vibration between the base and the cap when the linkage is in the unlocked state.

11. The locking isolator of claim 10, wherein
    the linkage comprises one or more joints, each one of the joints is configured to transition between a clearance fit and an interference fit in response to one of the first change in temperature and the second change in temperature.

12. The locking isolator of claim 11, wherein each joint of the one or more joints comprises:
    a first portion, having a first coefficient of thermal expansion; and
    a second portion, having a second coefficient of thermal expansion that is different than the first coefficient of thermal expansion.

13. The locking isolator of claim 10, wherein the linkage comprises one or more joints, wherein the linkage further comprises:
  a first link, coupled to the base by a first joint of the one or more joints; and
  a second link, coupled to the first link by a second joint of the one or more joints, opposite the base,
  wherein the cap is coupled to the second link by a third joint of the one or more joints, opposite the first link.

14. The locking isolator of claim 13, wherein:
  above a first transition temperature, the first joint has a clearance fit, in which the first link is movable relative to the base, or has an interference fit, in which the first link is fixed relative to the;
  above a second transition temperature, the second joint has the clearance fit, in which the second link is movable relative to the first link, or has the interference fit, in which the second link is fixed relative to the first link; and
  above a third transition temperature, the third joint has the clearance fit, in which the cap is movable relative to the second link, or has the interference fit, in which the cap is fixed relative to the second link.

15. The locking isolator of claim 10, wherein the piezoelectric cantilever has a length that is selected to resonate at the range of frequencies of the vibration.

16. A method of isolating a first structure of a structural system from a second structure of the structural system, the method comprising:
  coupling the first structure and the second structure together using a locking isolator;
  in response to a change in temperature, transitioning one or more joints of the locking isolator between a clearance fit state, in which the first structure and the second structure are movable relative to each other, and an interference fit state, in which the first structure and the second structure are fixed relative to each other; and
  attenuating transmission of vibration between the first structure and the second structure using a dampener of the locking isolator with the one or more joints in the clearance fit state.

17. The method of claim 16, further comprising heating the locking isolator to change the temperature.

18. The method of claim 16, further comprising cooling the locking isolator to change the temperature.

19. The method of claim 16, further comprising heating the one or more joints using a heating element.

20. The method of claim 19, further comprising:
  generating electric power in response to a mechanical strain using a piezoelectric generator; and
  energizing the heating element using the electric power.

* * * * *